US007173451B2

(12) United States Patent
Kanno et al.

(10) Patent No.: US 7,173,451 B2
(45) Date of Patent: Feb. 6, 2007

(54) PROGRAMMABLE LOGIC CIRCUIT APPARATUS AND PROGRAMMABLE LOGIC CIRCUIT RECONFIGURATION METHOD

(75) Inventors: Shinichi Kanno, Tokyo (JP); Masaya Tarui, Tokyo (JP); Taku Ohneda, Tokyo (JP); Riku Ogawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 11/081,589

(22) Filed: Mar. 17, 2005

(65) Prior Publication Data
US 2006/0017459 A1    Jan. 26, 2006

(30) Foreign Application Priority Data
Jul. 20, 2004    (JP)    ............... 2004-211480

(51) Int. Cl.
  *H03K 19/173*    (2006.01)
(52) U.S. Cl. .............................. 326/38; 326/39; 326/41
(58) Field of Classification Search ............ 326/38–41, 326/47
See application file for complete search history.

(56) References Cited

U.S. PATENT DOCUMENTS

| 6,034,538 | A | 3/2000 | Abramovici | |
| 6,924,663 | B2* | 8/2005 | Masui et al. ................... | 326/38 |
| 2004/0250046 | A1* | 12/2004 | Gonzalez et al. ............. | 712/11 |

FOREIGN PATENT DOCUMENTS

JP    2001-202236    7/2001

OTHER PUBLICATIONS

Yuichiro Shibata, et al., "A Data Driven Virtual Hardware Using an FPGA Integrated with DRAM", Journal of Information Processing Society of Japan, May 1999, vol. 40, No. 5, pp. 1935-1946 (With English Translation, pp. 1-21).

Xiaoping Ling, et al., "WASMII: A Multifunction Programmable Logic Device (MPLD) with Data Driven Control", Journal of the Institute of Electronics, Information and Communication Engineers, Apr. 1994, D-I vol. J77-D-I, No. 4, pp. 309-317 (With English Translation, pp. 1-20).

U.S. Appl. No. 10/960,707, filed Oct. 8, 2004, Taku Ooneda et al.
U.S. Appl. No. 10/948,702, filed Sep. 24, 2004, Shinichi Kanno et al.
U.S. Appl. No. 11/081,589, filed Mar. 17, 2005, Kanno et al.
U.S. Appl. No. 11/387,872, filed Mar. 24, 2006, Kanno et al.
U.S. Appl. No. 11/081,589, filed Mar. 17, 2005, Kanno et al.
U.S. Appl. No. 11/128,187, filed May 13, 2005, Ohneda et al.

* cited by examiner

*Primary Examiner*—Anh Q. Tran
(74) *Attorney, Agent, or Firm*—Oblon, Spivak, McClelland, Maier & Neustadt, P.C.

(57) ABSTRACT

A programmable logic circuit apparatus includes a programmable logic circuit that dynamically switches and operates a plurality of circuit blocks. The circuit blocks include a branch circuit block that performs branch processing and a plurality of child circuit blocks that selectively perform a plurality of kinds of processing on data obtained by the branch circuit block. The apparatus also includes a storage unit that stores data obtained by the branch circuit block and an identifier of a child circuit block into which the data is input. The identifier is associated with the data. The apparatus also includes a controller that causes the programmable logic circuit to process data associated with the same identifier as an identifier of a child circuit block being in operation in the programmable logic circuit, among the data stored in the storage unit, in preference to data associated with identifiers of other child circuit blocks.

12 Claims, 17 Drawing Sheets

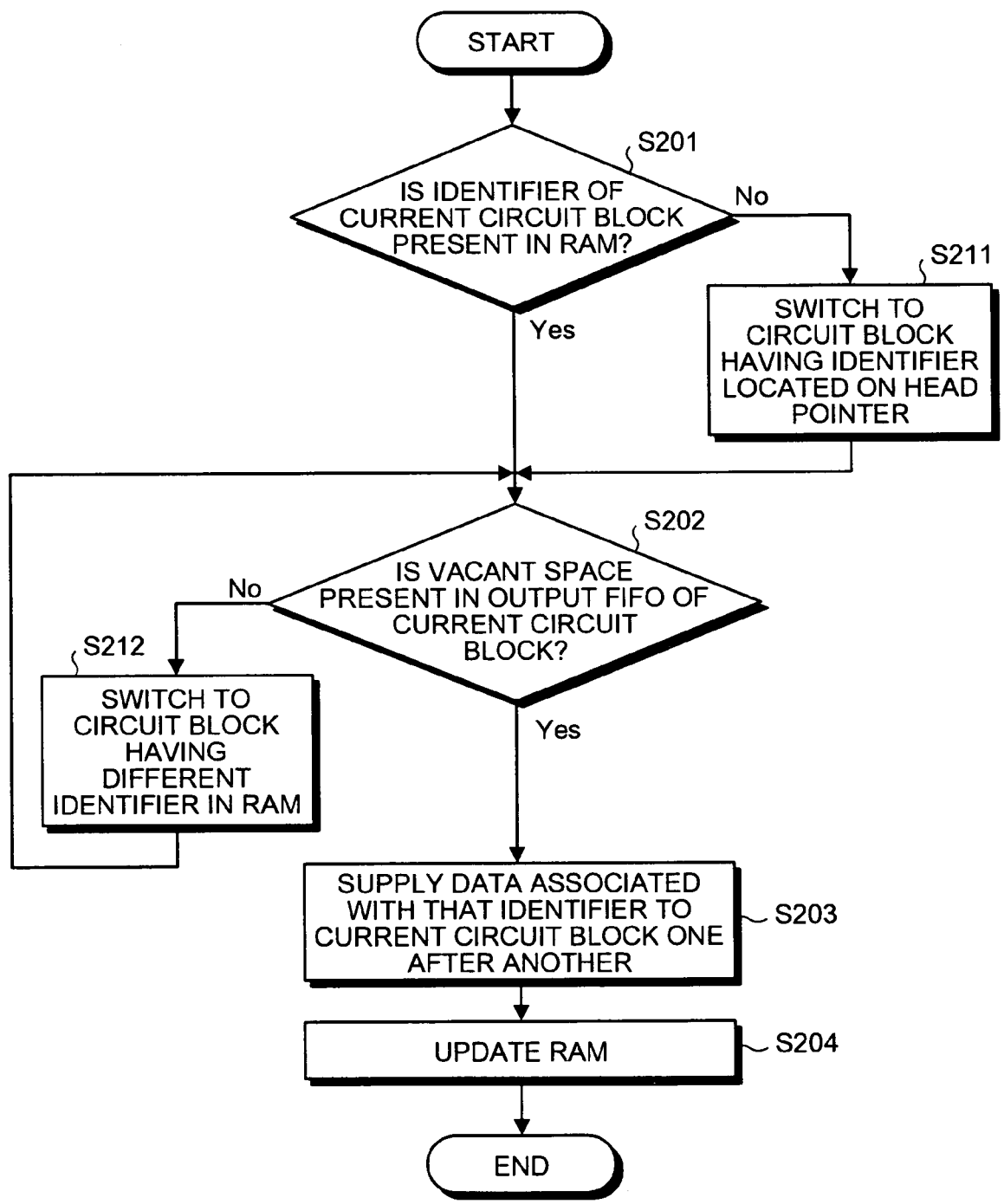

FIG.6A

| POINTER | IDENTIFIER | DATA |
|---------|------------|-------|
| addr9 | SD | DATA9 |
| addr8 | SB | DATA8 |
| addr7 | SD | DATA7 |
| addr6 | BA | DATA6 |
| addr5 | SB | DATA5 |
| addr4 | SD | DATA4 |
| addr3 | SE | DATA3 |
| addr2 | SB | DATA2 |
| addr1 | SB | DATA1 |

FIG.6B

| POINTER | IDENTIFIER | DATA |
|---------|------------|-------|
| addr5 | SD | DATA9 |
| addr4 | SD | DATA7 |
| addr3 | BA | DATA6 |
| addr2 | SD | DATA4 |
| addr1 | SE | DATA3 |

FIG.8A

| POINTER | NUMBER | IDENTIFIER | DATA |
|---|---|---|---|
| addr5 | 5 | SB | DATA5 |
| addr4 | 4 | SD | DATA4 |
| addr3 | 3 | SB | DATA3 |
| addr2 | 2 | SD | DATA2 |
| addr1 | 1 | SD | DATA1 |

FIG.8B

| NUMBER | DATA |
|---|---|
| 5 | DATA15 |
| 3 | DATA13 |

FIG.8C

| NUMBER | DATA |
|---|---|
| 4 | DATA14 |
| 2 | DATA12 |
| 1 | DATA11 |

FIG.8D

| NUMBER | DATA |
|---|---|
| 5 | DATA15 |
| 4 | DATA14 |
| 3 | DATA13 |
| 2 | DATA12 |
| 1 | DATA11 |

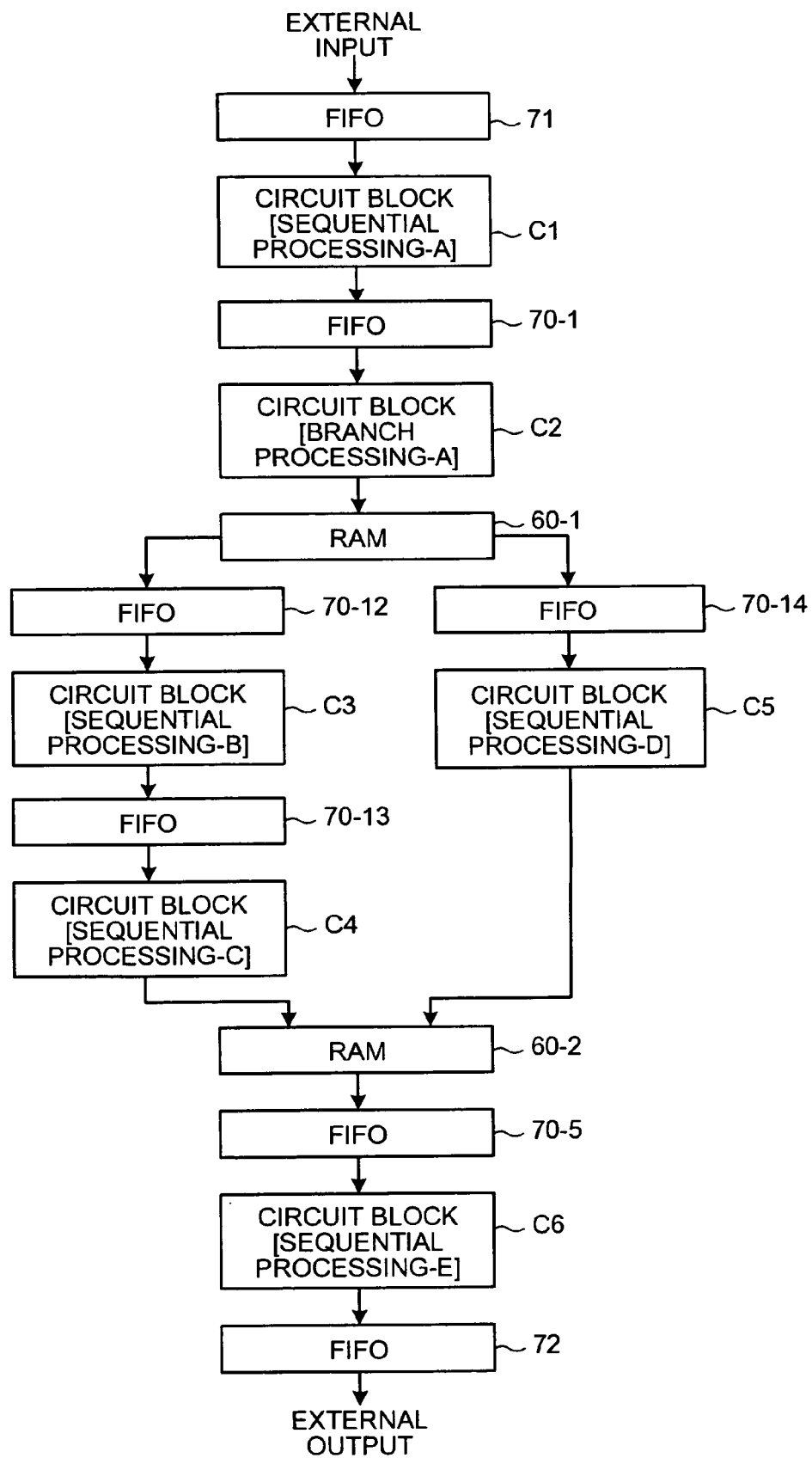

FIG.10A

| NUMBER | DATA |
|---|---|
| 5 | DATA5 |
| 3 | DATA3 |

FIG.10B

| NUMBER | DATA |
|---|---|
| 4 | DATA4 |
| 2 | DATA2 |
| 1 | DATA1 |

PROGRAMMABLE LOGIC CIRCUIT APPARATUS AND PROGRAMMABLE LOGIC CIRCUIT RECONFIGURATION METHOD

CROSS-REFERENCE TO RELATED APPLICATIONS

This application is based upon and claims the benefit of priority from the prior Japanese Patent Application No. 2004-211480 filed on Jul. 20, 2004 the entire contents of which are incorporated herein by reference.

BACKGROUND OF THE INVENTION

1) Field of the Invention

The present invention relates to a programmable logic circuit apparatus that can be dynamically reconfigured and a programmable logic circuit reconfiguration method. More particularly, the present invention relates to a programmable logic circuit apparatus that can operate processing including branching operating and a programmable logic circuit reconfiguration method that can configure unit circuits including branching processing.

2) Description of the Related Art

As a logic circuit that can be dynamically reconfigured, a Dynamically Programmable Gate Array (DPGA) is known (see Japanese Patent Application Laid-Open No. 2001-202236; Yuichiro SHIBATA et al., "A data driving virtual hardware using an FPGA integrated with DRAM", Journal of Information Processing Society of Japan, Vol. 40, No. 5, May 1999, pp. 1935–1945; and Xiaoping LING et. al., "WASMII: A multifunction programmable logic device (MPLD) with data driven control", Journal of the Institute of Electronics, Information and Communication Engineers, D-I, Vol. J77-D-1, No. 4, April 1994, pp. 309–317). The DPGA includes, for example, a plurality of logic blocks which are arranged in a matrix and a plurality of inter-logic-block connectors connecting the blocks. Each logic block provides a comparatively simple logic circuit based on circuit block information and state information which are supplied from an external device.

Specifically, the logic block includes a Look-Up Table (LUT) that can provide a function depending on the circuit block information, and a flip-flop that is initialized by the state information and that holds an output of the LUT.

Each inter-logic-block connector connects between an output of a logic block and an input of a different logic block based on connection information supplied from the external device. In other words, the inter-logic-block connector forms a complicated logic circuit by connecting the logic blocks.

A circuit to be implemented by using the DPGA is previously divided into a plurality of circuit blocks so that the processing by the circuit is performed by the pipeline processing. The DPGA, which merely forms a single circuit block, substantially performs a pipeline processing by reconfiguring the circuit block in an extremely short time, and consequently provides a function of the circuit to be implemented.

However, the conventional DPGA is suitable to provide a circuit including simple sequential processing, and the conventional DPGA does not actively cope with complicated processing such as branch processing which makes the throughput of the whole circuit low by occurrence of frequent circuit block switching.

SUMMARY OF THE INVENTION

According to one aspect of the present invention, a programmable logic circuit apparatus is provided, which includes a programmable logic circuit that dynamically switches and operates a plurality of circuit blocks. The circuit blocks include a branch circuit block that performs branch processing and a plurality of child circuit blocks that selectively perform a plurality of kinds of processing on data obtained by the branch circuit block. The apparatus also includes a storage unit that stores data obtained by the branch circuit block and an identifier of a child circuit block into which the data is input. The identifier is associated with the data. The apparatus also includes a controller that causes the programmable logic circuit to process data associated with the same identifier as an identifier of a child circuit block being in operation in the programmable logic circuit, among the data stored in the storage unit, in preference to data associated with identifiers of other child circuit blocks.

According to another aspect of the present invention, a programmable logic circuit reconfiguration method is provided, which is of reconfiguring a programmable logic circuit that dynamically switches and operates a plurality of circuit blocks. The circuit blocks include a branch circuit block that performs branch processing and a plurality of child circuit blocks that selectively perform a plurality of kinds of processing on data obtained by the branch circuit block. The method includes storing data obtained by the branch circuit block and an identifier of a child circuit block into which the data is input, in a storing unit, the identifier being associated with the data; and causing the programmable logic circuit to process data associated with the same identifier as an identifier of a child circuit block being in operation in the programmable logic circuit, among the data stored in the storage unit, in preference to data associated with identifiers of other child circuit blocks.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a flow chart of data processing conducted on a branch processing memory in the programmable logic circuit apparatus according to the first embodiment;

FIG. 6A shows an example of data stored in a memory area;

FIG. 6B depicts an update result of a memory shown in FIG. 6A;

FIG. 8A shows an example of data stored in a memory area shown in FIG. 7;

FIG. 8B shows an example of data processed by a series of sequential processing started in a circuit block C3 after branching;

FIG. 8C shows an example of data processed by a series of sequential processing started in a circuit block C5 after branching;

FIG. 8D shows an example of data rearranged in order of decreasing number;

FIG. 9 shows an example of pipeline processing conducted in an object circuit including branch processing, in a programmable logic circuit apparatus according to a third embodiment;

FIG. 10A shows an example of data input to the circuit block C3 after branching;

FIG. 10B shows an example of data input to the circuit block C5 after branching;

DETAILED DESCRIPTION

A simple pipeline processing performed in a general programmable logic circuit apparatus that can be dynamically reconfigured will now be explained below.

Figure 11:
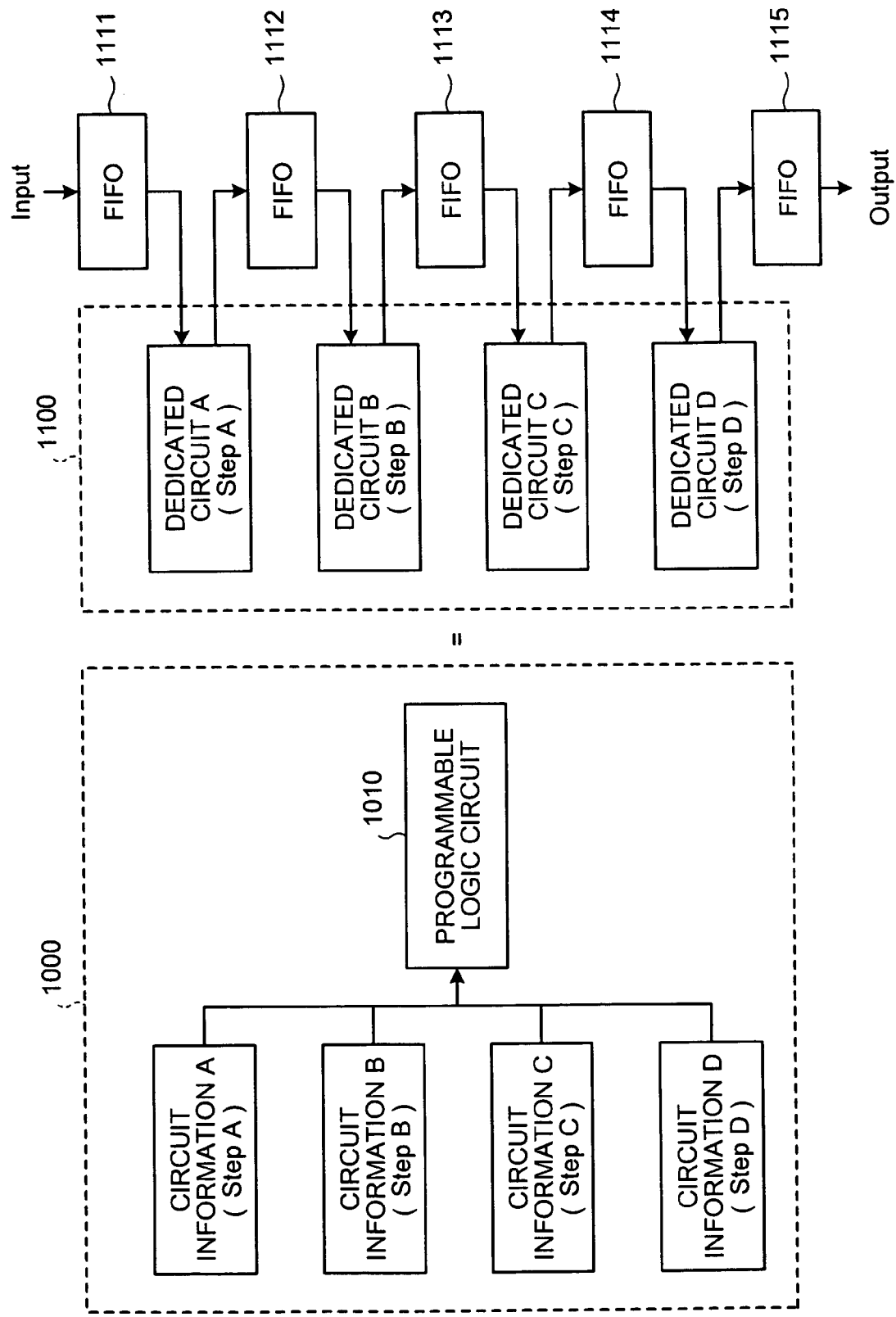
FIG. 11 is a functional block diagram of a programmable logic circuit (DPGA)

FIG. 11 is a functional block diagram of a general programmable logic circuit apparatus. In an example shown in FIG. 11, a simple pipeline processing including four steps ranging from step A to step D is performed in one programmable logic circuit apparatus 1000.

In general, a series of processing thus including different steps can be implemented easily by using a combination of a dedicated circuit group 1100 including dedicated circuits A, B, C, and D associated with the respective steps and First-in First-out (FIFO) memories 1111 to 1115 that temporarily store inputs/outputs of the respective dedicated circuits. In the programmable logic circuit apparatus 1000 shown in FIG. 11, however, the four dedicated circuits are implemented by using the programmable logic circuit apparatus 1000 including a programmable logic circuit 1010 and circuit information A, B, C, and D. It is herein supposed that one programmable logic circuit 1010 is used to simplify explanation.

The programmable logic circuit 1010 is the DPGA, which is a kind of the dynamically reconfigurable logic circuit. The programmable logic circuit 1010 implements an arbitrary logic circuit based on circuit information provided from an external device. For example, if the circuit information A is provided, the programmable logic circuit 1010 operates as a circuit A (circuit block A). If the circuit information B is provided, the programmable logic circuit 1010 operates as a circuit B (circuit block B). If the circuit information C is provided, the programmable logic circuit 1010 operates as a circuit C (circuit block C). If the circuit information D is provided, the programmable logic circuit 1010 operates as a circuit D (circuit block D).

In general, when the circuit information X is provided, the programmable logic circuit 1010 operates as a circuit X (circuit block X). In other words, the programmable logic circuit 1010 operates as a circuit (circuit block) corresponding to the circuit information which is provided to the programmable logic circuit 1010.

Figure 12:
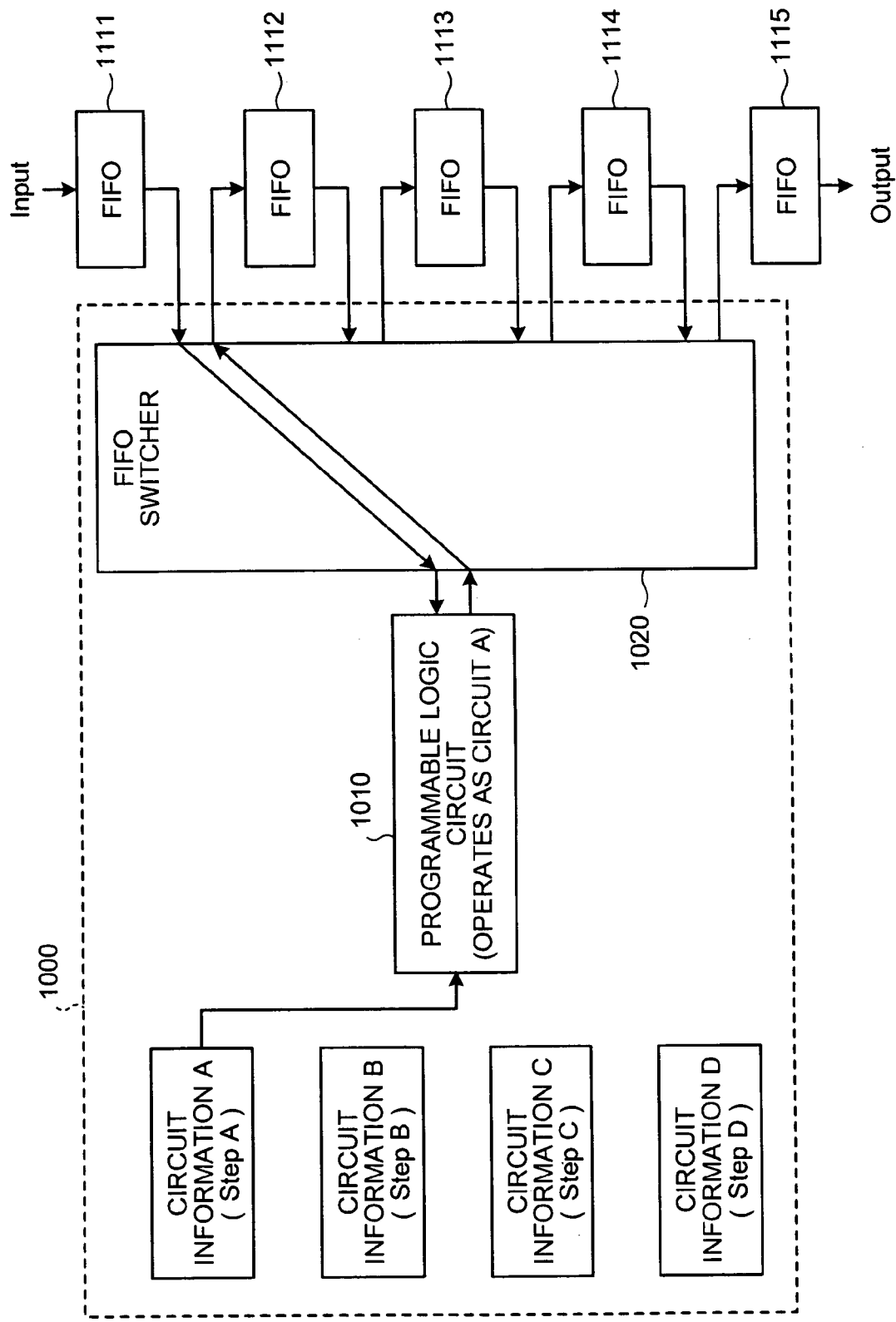
FIG. 12 is a schematic block diagram of a programmable logic circuit apparatus operating as a circuit A.
Figure 13:
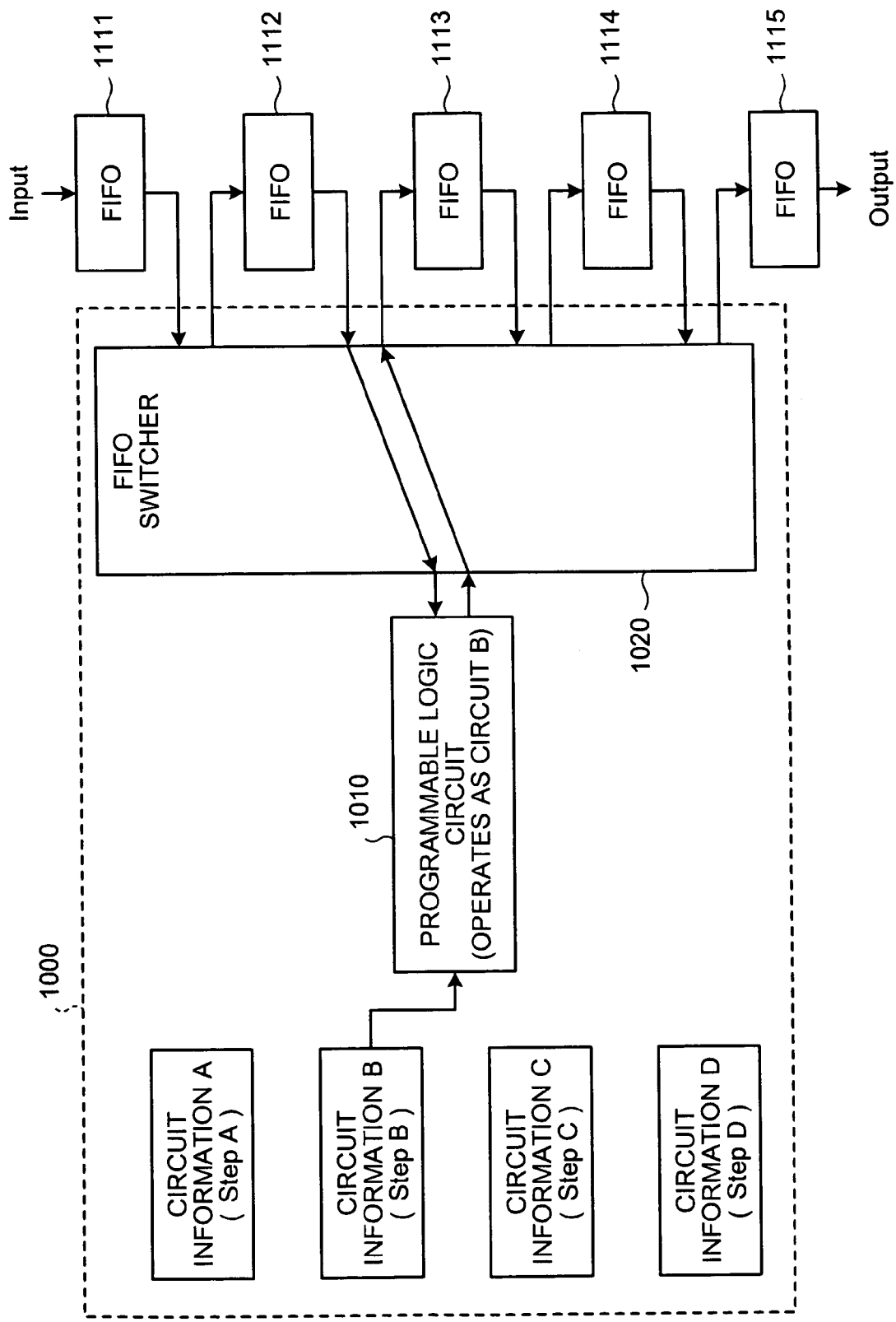
FIG. 13 is a schematic block diagram of a programmable logic circuit apparatus operating as a circuit B.
Figure 14:
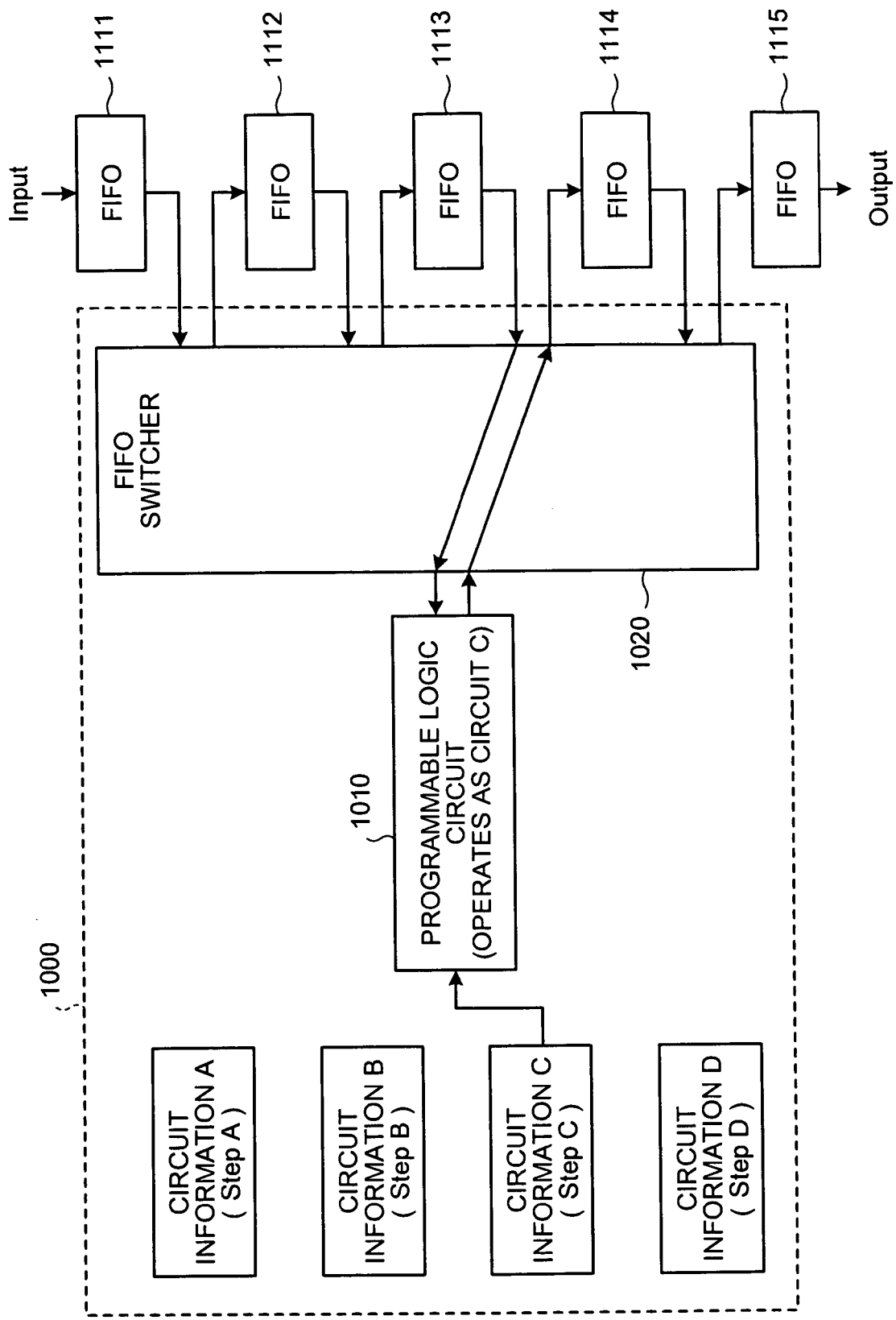
FIG. 14 is a schematic block diagram of a programmable logic circuit apparatus operating as a circuit C.
Figure 15:
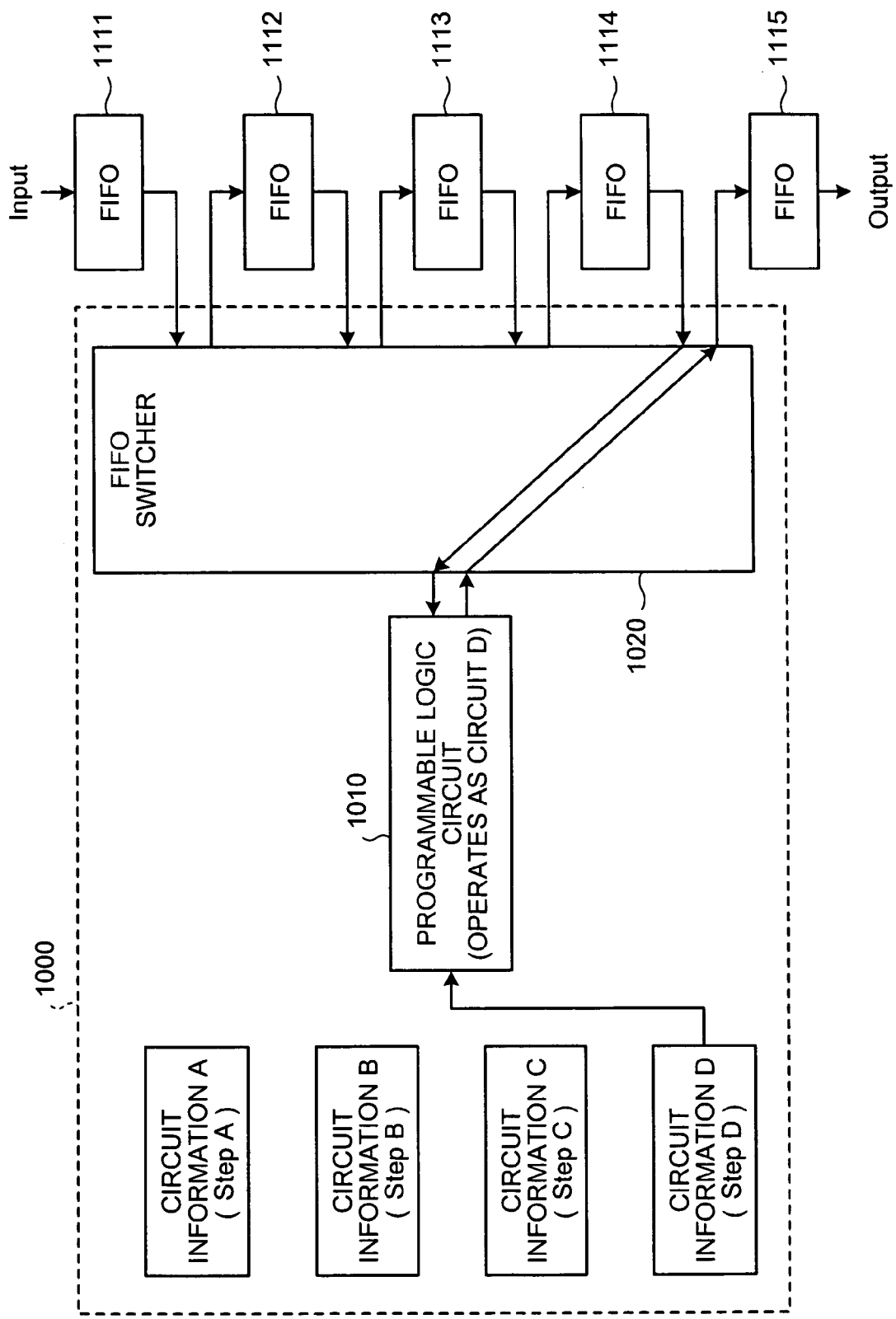
FIG. 15 is a schematic block diagram of a programmable logic circuit apparatus operating as a circuit D.

The circuit configuration of the programmable logic circuit 1010 can be reconfigured. Changing the circuit information provided to the programmable logic circuit 1010 can change the circuit configuration of the programmable logic circuit 1010. For example, as shown in FIG. 12, the programmable logic circuit 1010 can operate as the circuit A based on the circuit information A. If the circuit information B is provided, the programmable logic circuit 1010 operates as the circuit B as shown in FIG. 13. If the circuit information C or D is provided to the programmable logic circuit 1010, the programmable logic circuit 1010 can operate as the circuit C or the circuit D as shown in FIG. 14 or FIG. 15.

In other words, as shown in FIGS. 12 to 15, it is possible to make the programmable logic circuit 1010 operate as the circuit A at a time, operate as the circuit B at another time, operate as the circuit C at still another time, and operate as the circuit D at yet another time. At a time, therefore, only processing in the circuit A is performed and processing in other circuits (B to D) are stopped. Thus, processing at the steps A, B, C, and D are performed while the circuitry implemented in the programmable logic circuit 1010 is changed momentarily.

As shown in FIGS. 12 to 15, the programmable logic circuit apparatus 1000 further includes a FIFO switcher 1020. In order to change the circuit implemented in the programmable logic circuit 1010, the FIFO switcher 1020 changes a FIFO memory connected to the programmable logic circuit 1010. For example, when making the programmable logic circuit 1010 operate as the circuit C, the FIFO switcher 1020 connects a FIFO 1113 to an input side of the programmable logic circuit 1010 and connects a FIFO 1114 to an output side. When making the programmable logic circuit 1010 operate as the circuit D, the FIFO switcher 1020 connects the FIFO 1114 to the input side of the programmable logic circuit 1010 and connects a FIFO 1115 to the output side.

The order of operating the programmable logic circuit 1010 as the circuit A, B, C, and D may be predetermined, or determined dynamically.

Figure 16:
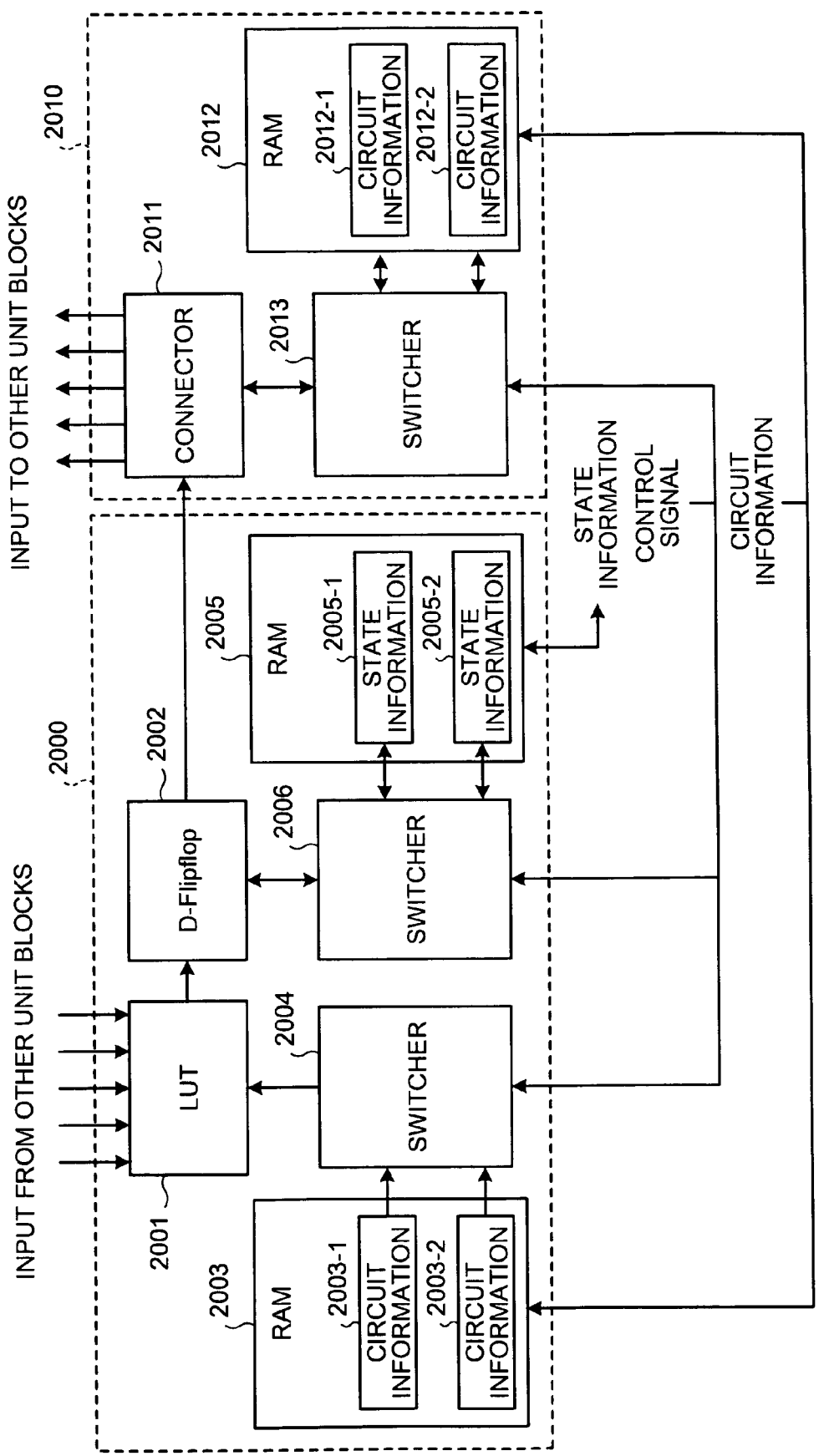
FIG. 16 is a block diagram of an internal configuration of a programmable logic circuit.

FIG. 16 is a block diagram of an internal configuration of the programmable logic circuit 1010. The programmable logic circuit 1010 includes a plurality of unit blocks 2000 and a plurality of inter-unit-block connectors 2010 that connect between the unit blocks. Each unit block 2000 includes an LUT 2001 that performs logical operation on input data, and a D-Flip-Flop 2002 that provides a computed result of the LUT 2001 with synchronization when outputting it to another unit block.

Each unit block 2000 further includes a random access memory (RAM) 2003 that stores a plurality of circuit information pieces, and a switcher 2004 that switches circuit information pieces provided to the LUT 2001. The circuit information of a unit circuit configured on the programmable logic circuit 1010 includes a circuit information piece of each unit block 2000. Generally, RAM 2003 stores the circuit information pieces for a mutually different unit circuit, but RAM 2003 may store for the same unit circuit.

Each unit block 2000 further includes a RAM 2005 that saves and restores state information pieces in the D-Flip-Flop 2002 when switching circuit information pieces provided to the LUT 2001, and a switcher 2006 that switches the saved and restored state information pieces. State information of a unit circuit configured on the programmable logic circuit 1010 includes a state information piece of each unit block 2000. Generally, RAM 2005 stores the state information pieces for a mutually different unit circuit, but RAM 2005 may store for the same unit circuit.

Each inter-unit-block connector 2010 includes a connector 2011 that outputs an output of a unit block 2000 to a different unit block 2000 based on a circuit information piece concerning a connection relation between the unit blocks, a RAM 2012 that stores a plurality of circuit information pieces to prescribe connection relations between the unit blocks, and a switcher 2013 that switches circuit information pieces provided to the connector 2011. The circuit information of a unit circuit configured on the programmable logic circuit 1010 further includes a circuit information piece of each inter-unit-block connector 2010. Generally, RAM 2012 stores the circuit information pieces for a mutually different unit circuit, but RAM 2012 may store for the same unit circuit.

The RAM 2003 receives a plurality of circuit information pieces concerning logic computation from the external device, and stores them. The RAM 2012 receives a plurality of circuit information pieces concerning connection relation between the unit blocks from the external device, and stores them. The RAM 2005 exchanges a plurality of state information pieces with the external device. Each of the switchers 2004, 2006, and 2013 receives a control signal from the external device and performs switching operation.

In the foregoing explanation, the LUT 2001 performs logical operation. However, the LUT 2001 may be able to perform arithmetic operation and a simple program.

Figure 17:
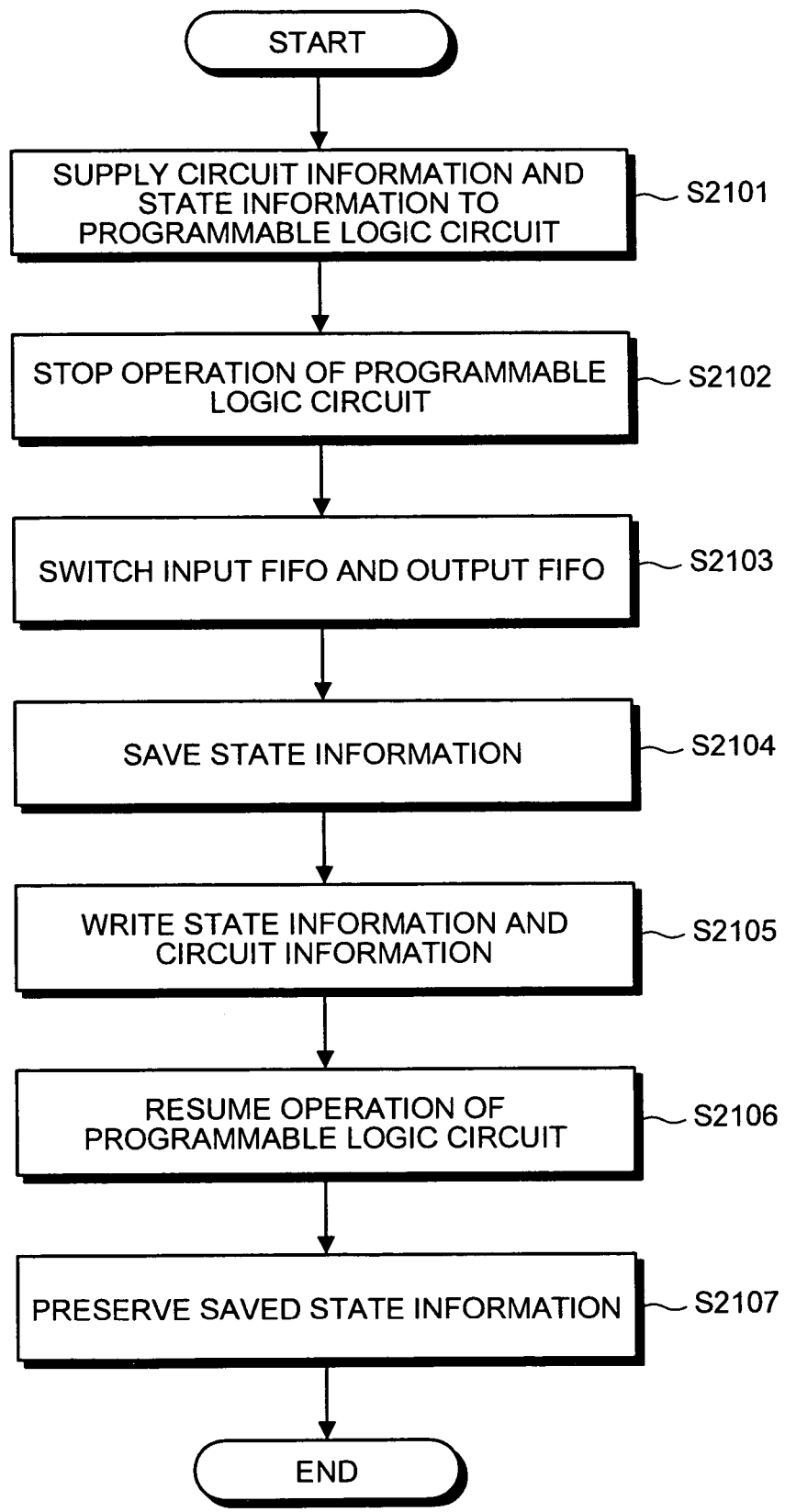
FIG. 17 is a flow chart of a procedure of reconfiguration during operation of the programmable logic circuit shown in FIG. 16.

FIG. 17 is a flow chart of a procedure of reconfiguration during operation of the programmable logic circuit 1010. It is supposed herein that the control of the reconfiguration is performed by a controller, not shown, which is disposed outside the programmable logic circuit 1010.

The controller supplies a circuit information piece 2003-2 and a circuit information piece 2012-2 corresponding to a unit circuit to be operated subsequently, from the external device respectively to the RAM 2003 and RAM 2012 for each unit block 2000 on the programmable logic circuit 1010, and provides a state information piece 2005-2 corresponding to a unit circuit to be operated subsequently, from the external device to the RAM 2005 for each inter-unit-block connector 2010 on the programmable logic circuit 1010 (step S2101).

The controller stops supply of a clock signal to the programmable logic circuit 1010 to stop the processing (step S2102).

The controller connects FIFOs (not shown) corresponding to the circuit to be operated subsequently, to the programmable logic circuit 1010 (step S2103).

The controller sends a control signal to the switcher 2006 to save a state information piece held in the D-Flip-Flop 2002 into the RAM 2005 (step S2104). The saved state information piece is stored in the RAM 2005 as a state information piece 2005-1.

The controller writes a circuit information piece into the LUT 2001 and writes a state information piece into the D-Flip-Flop 2002 (step S2105). Specifically, the controller sends a control signal to the switcher 2004. The switcher 2004 copies the circuit information piece 2003-2 concerning the configuration of the circuit to be operated subsequently from the RAM 2003 to the LUT 2001. The controller sends a control signal to the switcher 2013. The switcher 2013 copies the circuit information piece 2012-2 concerning the connection relation of the circuit to be operated subsequently from the RAM 2012 to the connection unit 2011. The controller sends a control signal to the switcher 2006. The switcher 2006 restores the state information piece 2005-2 corresponding to the circuit to be operated subsequently on the D-Flip-Flop 2002.

The controller resumes the supply of the clock signal (step S2106). If necessary, the state information piece 2005-1 saved in the RAM 2005 at the step S2104 may be stored in an external memory, not shown (step S2107).

Reconfiguration of the logical configuration is performed by the procedure explained above. If necessary data is already stored in the RAMs 2003, 2005, and 2012, the step S2101 can be omitted. Basic operation of the programmable logic circuit apparatus 1000 performed when executing a simple pipeline processing is explained above.

Exemplary embodiments of the programmable logic circuit apparatus and the programmable logic circuit reconfiguration method according to the present invention will be explained below in detail with reference to the accompanying drawings.

A programmable logic circuit apparatus according to a first embodiment configures an object circuit involving branch processing by using a programmable logic circuit. More specifically, the present apparatus configures the object circuit by dynamically switching, on the programmable logic circuit, circuit blocks obtained by dividing the object circuit. A basic configuration and basic operation of the present apparatus follow the DPGA. Especially, the programmable logic circuit apparatus according to the first embodiment has a feature that data to be delivered to a circuit block of branch destination is provided with an identifier of the circuit block and data to be delivered to a circuit block that is being currently configured on the programmable logic circuit (hereafter, "current circuit block") is processed preferentially by using the identifier as a key. The object circuit herein means a logic circuit configured of a plurality of circuit blocks, and it is a functional circuit consequently provided by the programmable logic circuit apparatus.

Figure 1:
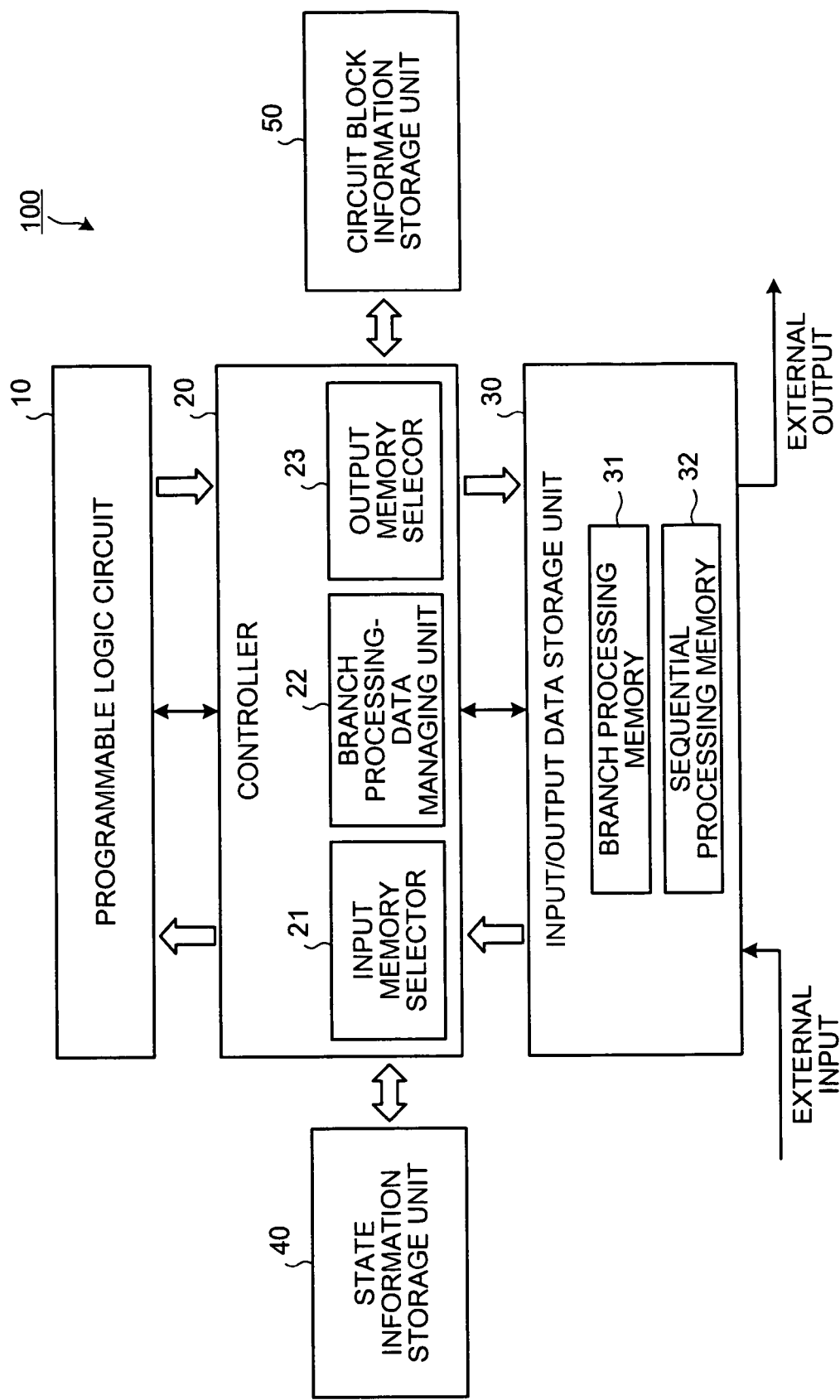
FIG. 1 is a block diagram of a programmable logic circuit apparatus according to a first embodiment.

FIG. 1 is a block diagram of the programmable logic circuit apparatus according to the first embodiment. In FIG. 1, a programmable logic circuit apparatus 100 includes a programmable logic circuit 10, a controller 20, an input/output data storage unit 30, a state information storage unit 40, and a circuit block information storage unit 50.

The programmable logic circuit 10 is an integrated circuit provided as a DPGA. The circuit block information storage unit 50 stores circuit information of respective circuit blocks configured on the programmable logic circuit 10. Specifically, LUT information respectively provided to a plurality of logic blocks in the programmable logic circuit 10 is arranged and stored for every circuit block.

The state information storage unit 40 stores state information of respective circuit blocks configured on the programmable logic circuit 10. Specifically, states of respective flip-flops included in a plurality of logic blocks in the programmable logic circuit 10 are arranged and stored for every circuit block. Owing to the state information storage unit 40, circuit blocks in specific states can be configured on the programmable logic circuit 10.

The input/output data storage unit 30 stores data input to the programmable logic circuit 10 and data output from the programmable logic circuit 10. In other words, the input/output data storage unit 30 functions as an interface that connects between the circuit blocks in pipeline processing. Specifically, the input/output data storage unit 30 includes a branch processing memory 31 used for branch processing besides a sequential processing memory 32 used for processing that does not include branch processing (hereafter, "sequential processing"). More specifically, the sequential processing memory 32 stores data input to a circuit block that performs sequential processing or data output from the circuit block. The branch processing memory 31 stores data output from a circuit block including branch processing. The sequential processing memory 32 also stores data input from the outside of the present programmable logic circuit apparatus 100 to an object circuit implemented by the programmable logic circuit 10, and data output from the object circuit to the outside of the programmable logic circuit apparatus 100.

The controller 20 performs the following processing according to a predetermined program that prescribes the pipeline processing: stop the operation of the programmable logic circuit 10; save state information in the state information storage unit 40; obtain circuit block information and state information of a circuit block to be configured subsequently from the circuit block information storage unit 50 and the state information storage unit 40, to configure a new circuit block; switch the branch processing memory or the sequential processing memory; and resume the operation of the programmable logic circuit 10.

Figure 2:
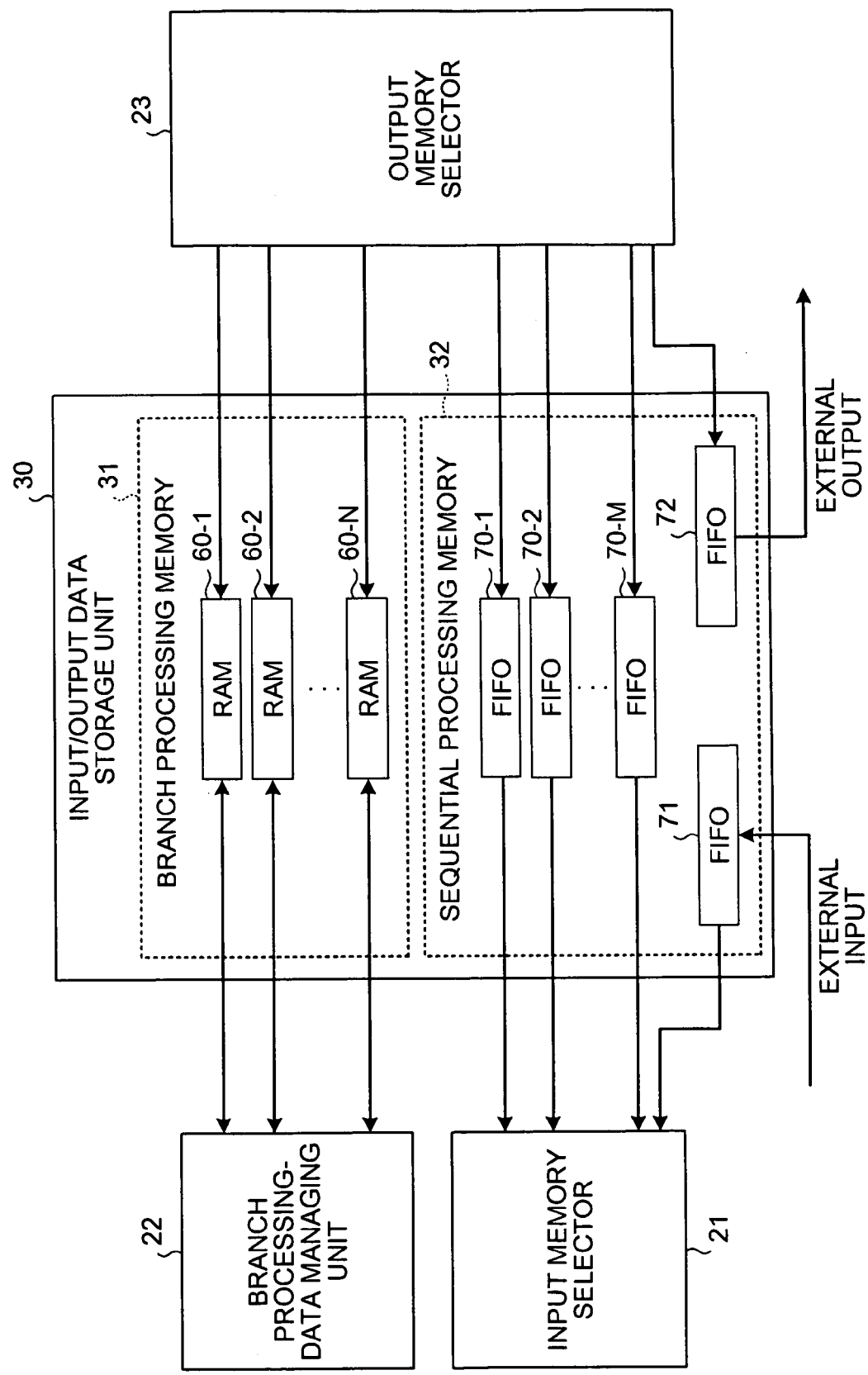
FIG. 2 is a block diagram of an internal configuration of an input/output data storage unit and a part of an internal configuration of a controller in the programmable logic circuit apparatus according to the first embodiment.

FIG. 2 is a block diagram of an internal configuration of the input/output data storage unit 30 and a part of an internal configuration of the controller 20. The branch processing memory 31 includes a RAM logically divided into N memory areas 60-1 to 60-N. N represents herein the number of branch processing (i.e., the number of circuit blocks including branch processing) included in the object circuit. The sequential processing memory 32 includes FIFO memories 70-1 to 70-M, a FIFO memory 71 for external input, and a FIFO memory 72 for external output. M represents herein the number of circuit blocks that perform the sequential processing.

Figure 3:
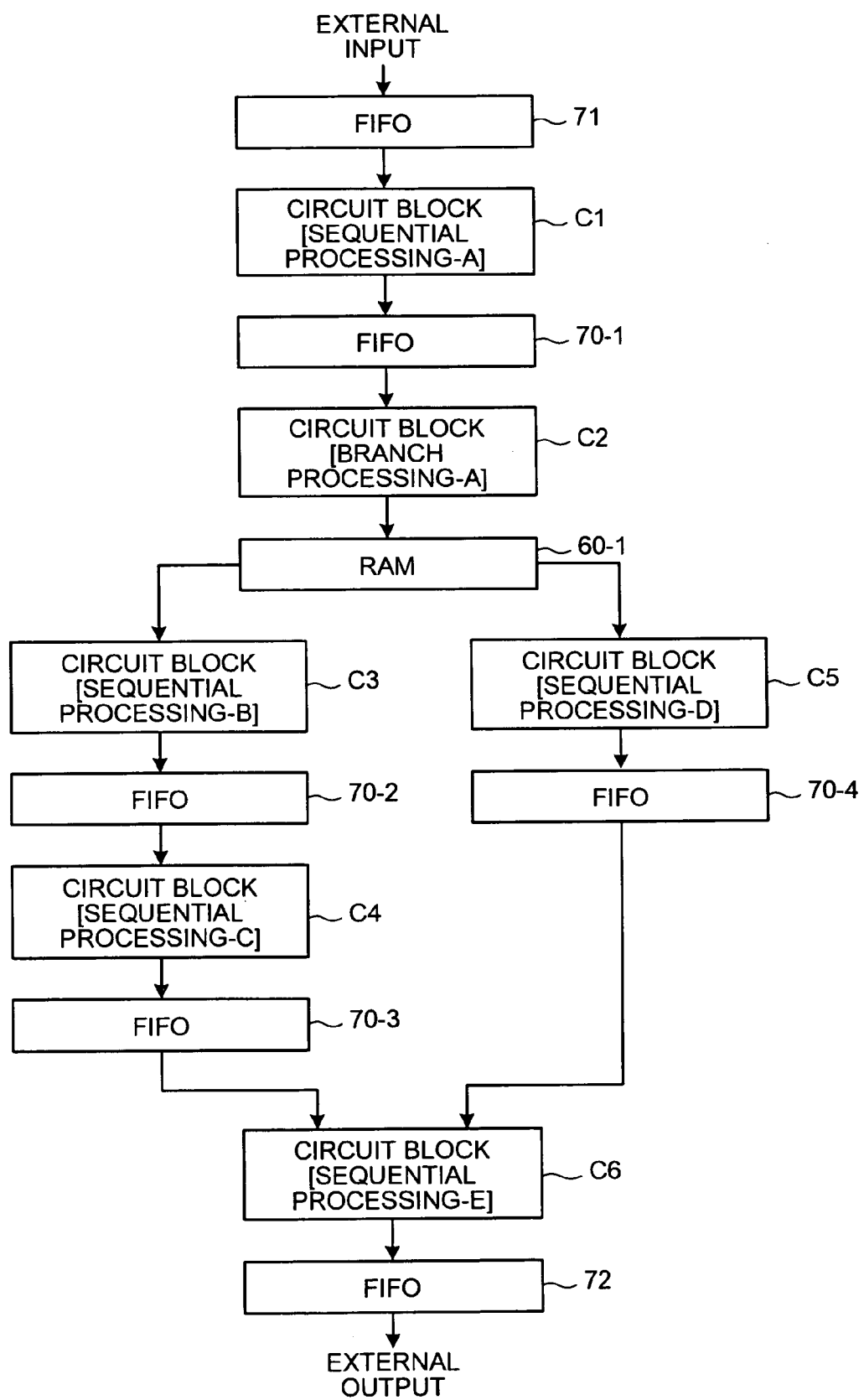
FIG. 3 shows an example of pipeline processing conducted in an object circuit including branch processing in the programmable logic circuit apparatus according to the first embodiment.

FIG. 3 shows an example of pipeline processing for an object circuit including branch processing, in the programmable logic circuit apparatus according to the first embodiment. In FIG. 3, the programmable logic circuit apparatus 100 configures a circuit block C1 located on a first stage of a pipeline processing, on the programmable logic circuit 10. At this time, an input memory selector 21 connects a FIFO memory 71 for external input to an input port of the circuit block C1, and an output memory selector 23 connects a FIFO memory 70-1 for sequential processing-A to an output port of the circuit block C1. As a result, the circuit block C1 performs sequential processing unique to the circuit block C1 on data stored in the FIFO memory 71, and outputs its result to the FIFO memory 70-1.

The programmable logic circuit apparatus 100 configures a circuit block C2 located on a second stage of the pipeline processing, on the programmable logic circuit 10. At this time, the input memory selector 21 connects the FIFO memory 70-1 for the sequential processing-A to an input port of the circuit block C2, and the output memory selector 23 connects the memory area 60-1 in the RAM for branch processing-A to an output port of the circuit block C2. As a result, the circuit block C2 performs branch processing unique to the circuit block C2 on data stored in the FIFO memory 70-1, and outputs its result to the memory area 60-1 in the RAM together with an identifier that indicates a circuit block of branch destination.

A branch processing data managing unit 22 acquires data located in a head pointer of the memory area 60-1 in the RAM and a circuit block identifier stored in association with the data, and configures a circuit block indicated by the identifier, on the programmable logic circuit 10. For example, if the circuit block identifier indicates a circuit block C3, the circuit block C3 is configured on the programmable logic circuit 10. At this time, the output memory selector 23 connects the FIFO memory 70-2 for sequential processing-B to an output port of a circuit block C3, and the branch processing data managing unit 22 transmits data located in the head pointer of the memory area 60-1 in the RAM to an input port of the circuit block C3 at suitable timing. If the circuit block identifier indicates a circuit block C5, the circuit block C5 is configured on the programmable logic circuit 10 in the same way. Other processing (which may be sequential processing or branch processing) having branch processing as a condition may be performed after the branch processing. In an example shown in FIG. 3, branching to the circuit block C3 is performed and then other sequential processing-C using a result of processing performed in the circuit block C3 is performed.

If at least one series of sequential processing is finished after branching, the programmable logic circuit 100 configures a circuit block C6 to be performed subsequently, on the programmable logic circuit 10. At this time, the input memory selector 21 connects the FIFO memories 70-3 and 704 located on a final stage of a plurality of series of sequential processing after branching to an input port of the circuit block C6, and the output memory selector 23 connects the FIFO memory 72 for external output to an output port of the circuit block C6. As a result, the circuit block C6 performs sequential processing unique to the circuit block C6 on data stored in the FIFO memories 70-3 and 70-4, and outputs its result to the FIFO memory 72 for external output. Data stored in the FIFO memory 72 for external output is taken out by an external apparatus connected to the programmable logic circuit apparatus 100 at predetermined timing.

As explained, the controller 20 basically switches the circuit blocks according to an order of pipeline processing shown in FIG. 3. After data of a given amount or more is input to the programmable logic circuit apparatus 100 as an external input, however, data are accumulated one after another in the input/output data storage unit 30 based on a difference in the number of output data and processing time between the circuit blocks. In other words, a state in which there are a lot of data waiting for processing is brought about, and the throughput of each circuit block falls. If circuit block switching is determined simply in the order in which the result of branch processing is output after the branch processing, the switching frequently occurs. Such an increase in the number of times of circuit block switching lowers the throughput of the whole programmable logic circuit apparatus 100. If branch processing that can take a large number of branch destinations is present, this problem becomes especially remarkable.

Therefore, the controller 20 in the programmable logic circuit apparatus 100 according to the present embodiment watches the input/output data storage unit 30, and switches the circuit blocks so as to connect a memory area in the RAM or a FIFO memory that stores at least a predetermined number of data to the programmable logic circuit 10 preferentially. In processing data stored in the branch processing memory 31, data having the same branch destination as that of the current circuit block set as the branch destination, among data stored in memory areas in the RAM is processed preferentially.

Figure 4:
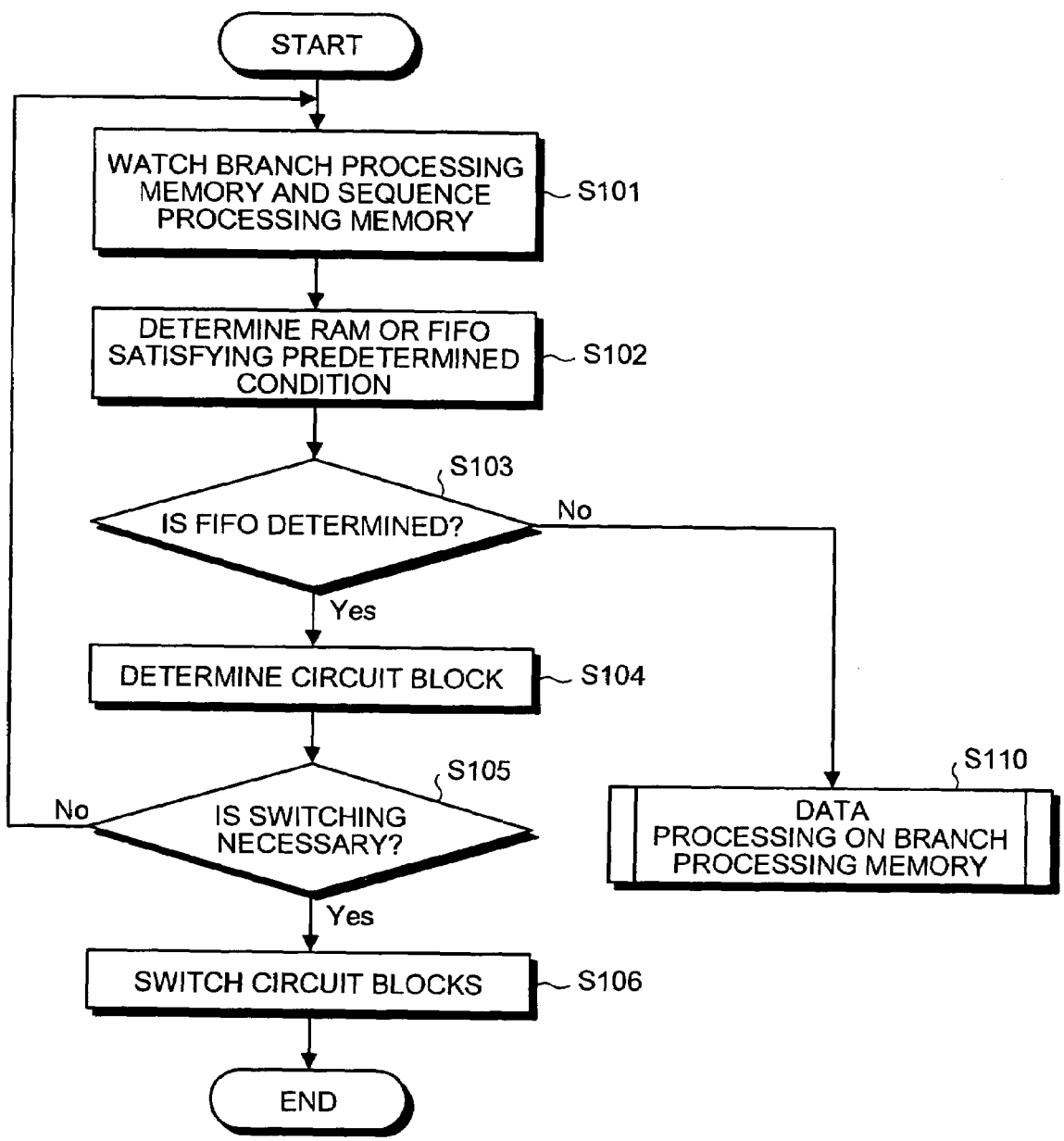
FIG. 4 is a flow chart of circuit block determining processing conducted in the programmable logic circuit apparatus according to the first embodiment.

FIG. 4 is a flow chart of circuit block determining processing performed in the programmable logic circuit apparatus 100 according to the first embodiment The programmable logic circuit apparatus 100 regularly watches the respective memory areas in the RAM in the branch processing memory 31 and FIFO memories in the sequential processing memory 32 at predetermined timings (step S101). As a result of watching, a RAM memory area or a FIFO memory satisfying a predetermined condition is determined (step S102). The RAM memory area satisfying the predetermined condition is, for example, a memory area storing at least a predetermined number of data, or a memory area storing at least a predetermined number of data assigned the same identifier. The FIFO memory satisfying a predetermined condition is, for example, a FIFO memory storing at least a predetermined number of data. Even if a memory area or a FIFO memory satisfying the predetermined condition is not present, a memory area or a FIFO memory closest to the condition is determined.

If a FIFO memory is determined at the step S102 (Yes at step S103), a circuit block to be connected to the FIFO memory as an input memory is determined (step S104). If the determined circuit block is different from the current circuit block (Yes at step S105), the circuit block configured on the programmable logic circuit 10 is switched to the circuit block determined at the step S104 (step S106). If the determined circuit block is the same as the current circuit block (No at step S105), the RAM memory areas in the branch processing memory 31 and FIFO memories in the sequential processing memory 32 are watched again (step S101). If a memory area in the RAM is determined at the step S102 (No at step S103), data processing for the branch processing memory 31 is performed (step S110).

FIG. 5 is a flow chart of data processing performed on the branch processing memory in the programmable logic circuit apparatus according to the first embodiment If a RAM memory area that satisfies the predetermined condition is determined (step S102 in FIG. 4), the branch processing data managing unit 22 determines whether the identifier of the current circuit block is present in the memory area (step S201). FIG. 6A shows an example of data stored in memory areas. As shown in FIG. 6A, each memory area has a record identified by a pointer. Each record has an identifier field in which an identifier of a circuit block is stored and a data field in which data processed by branch processing is stored. In FIG. 6A, a pointer 'addr1' is a head pointer.

A pair of an identifier and data is generated by a circuit block including branch processing. Specifically, the circuit block including branch processing assigns a circuit block identifier that indicates a branch destination determined by the branch processing to data output by the branch processing, and writes the pair of the data and the circuit block identifier into a record that is vacant and closest in pointer to the head pointer.

If the identifier of the current circuit block is present in the memory area at the step S201, it is further determined whether a vacant space of at least a predetermined quantity is present in an output memory (output FIFO) connected to the current circuit block (step S202). If there is a vacant space of at least a predetermined quantity (Yes at step S202), data corresponding to the identifier, i.e., data assigned with the identifier of the current circuit block is taken out from the memory area in the order of increasing distance from the head pointer and supplied to the current circuit block (step S203). A record to which data taken out belongs is deleted, and a main memory is updated so as to fill memory areas with remained records in order beginning with the head pointer (step S204). FIG. 6B depicts a result obtained by updating the memory areas shown in FIG. 6A. In the examples shown in FIGS. 6A and 6B, the current circuit block is identified by an identifier SB.

On the other hand, if the identifier of the current circuit block is not present in the memory area at the step S201, the circuit block configured on the programmable logic circuit 10 is switched to a circuit block having an identifier located on the head pointer in the memory areas (step S211). In the example shown in FIG. 6B, the circuit block is switched to a circuit block identified by an identifier SE. After the circuit block switching, the determination at the step S202 is carried out again.

If a vacant space of at least a predetermined quantity is not present at the step S202 (No at step S202), the circuit block configured on the programmable logic circuit 10 is switched to a circuit block having a different identifier stored in the memory areas (step S212). As the different identifier, for example, an identifier that is the most in the memory areas can be selected. After the circuit block switching, the determination at the step S202 is carried out again.

As explained above, the programmable logic circuit apparatus according to the first embodiment stores data obtained after the branch processing and identifiers of the circuit blocks that indicate branch destinations in the branch processing memory 31 in a pair form, and preferentially processes data assigned with the same identifier as that of the current circuit block. In other words, data to be input to the input port of the current circuit block is preferentially processed. As a result, the number of times of circuit block switching caused by branch processing can be held down to the minimum, and the throughput of the whole programmable logic circuit apparatus 100 can be increased.

A programmable logic circuit apparatus according to a second embodiment has a feature that data to be delivered to a circuit block of branch destination is provided with an identifier of the circuit block and a number indicating the output order, and data to be delivered to the current circuit block is processed preferentially by using the identifier and the number as a key.

The programmable logic circuit apparatus according to the second embodiment has a configuration similar to that of the apparatuses shown in FIGS. 1 and 2. However, processing conducted by the branch processing data managing unit differs partially from the processing conducted by the branch processing data managing unit 22 in the first embodiment. Specifically, the branch processing data managing unit in the programmable logic circuit apparatus according to the second embodiment stores the number that indicates data output order associated with data and the identifier when they are stored, in the branch processing memory 31, besides the function of the branch processing data managing unit 22 in the first embodiment. The number that indicates the data output order may be provided by a circuit block that performs branch processing instead of the branch processing data managing unit 22. The number that indicates the data output order may be a monotonously increasing sequence number, or may be a cyclic number in a predetermined numerical value range.

Figure 7:
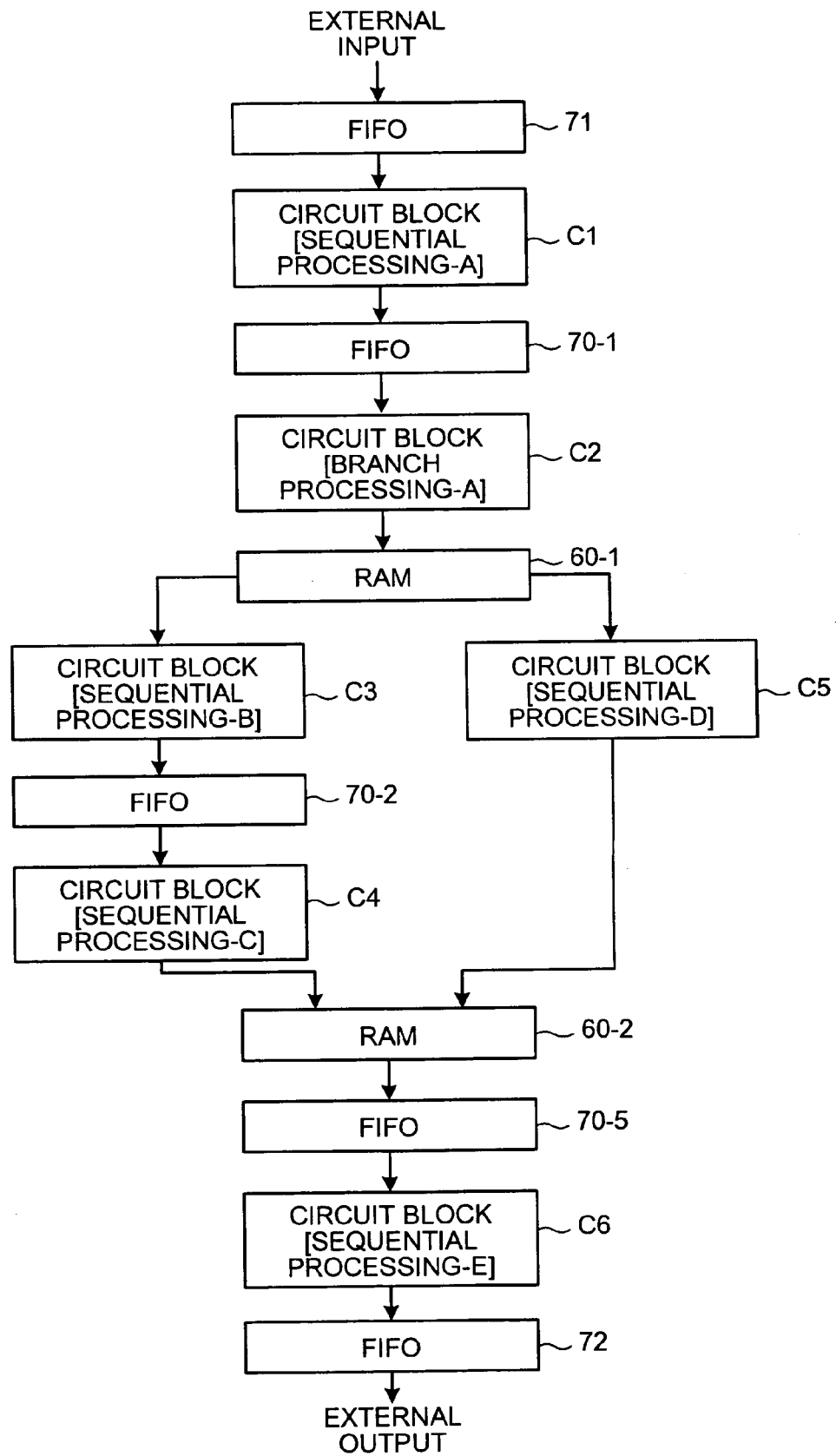
FIG. 7 shows an example of pipeline processing conducted in an object circuit including branch processing, in a programmable logic circuit apparatus according to a second embodiment.

FIG. 7 shows an example of pipeline processing of an object circuit including branch processing, in the programmable logic circuit apparatus according to the second embodiment. Pipeline processing shown in FIG. 7 differs from the pipeline processing shown in FIG. 3 in contents of the first memory area 60-1 in the RAM for branch processing-A and in that data output from the circuit blocks C4 and C5 are stored in the second memory area 60-2 in the RAM for branch processing-A, and in that data stored in the memory area 60-2 are rearranged based on the numbers associated with those data and resultant data are stored in the FIFO memory 70-5.

In other words, the programmable logic circuit apparatus according to the second embodiment has a feature that the processing order of data after the branch processing is ensured with respect to the programmable logic circuit apparatus according to the first embodiment FIG. 8A shows an example of data stored in the memory area 60-1 shown in FIG. 7. As shown in FIG. 8A, each memory area has a record identified by a pointer. Each record has a number field that indicates the data output order, an identifier field in which a circuit block identifier is stored, and a data field in which data processed by the branch processing is stored. FIG. 8B shows an example of data processed by a series of sequential processing beginning with the circuit block C3 after branching. FIG. 8C shows an example of data processed by a series of sequential processing beginning with the circuit block C5 after branching. As shown in FIGS. 8B and 8C, each circuit block can input a pair of a number and data, and output its processing result in a similar pair form.

The data shown in FIGS. 8B and 8C are stored in the second memory area 60-2 in the RAM for branch processing-A, and rearranged in the number order. FIG. 8D depicts its result (stored in the FIFO memory 70-5).

As explained above, the programmable logic circuit apparatus according to the second embodiment stores data obtained after the branch processing, the number indicating the data output order, and the identifier of the circuit block indicating the branch destination in the branch processing memory 31 in a set form, preferentially processes data assigned with the same identifier as that of the current circuit block among the stored data, and rearranges those data in the number order after a series of sequential processing following the branch processing. As a result, the data output order can be ensured before and after the branch processing besides the effects of the first embodiment explained earlier.

A hierarchy field for storing the hierarchy number of the branch processing may be added to a record of each memory area in the branch processing memory 31. Even if branch processing occurs again in the series of sequential processing after the branch processing, therefore, the data output order can be ensured. At this time, the hierarchy number is generated by the branch processing data managing unit 21.

A programmable logic circuit apparatus according to a third embodiment is a modified example of the programmable logic circuit apparatus according to the second embodiment. The programmable logic circuit apparatus according to the third embodiment has a feature that a set of data to be delivered to a circuit block of branch destination and a number indicating data output order is temporarily stored in a FIFO memory for the circuit block of branch destination.

FIG. 9 shows an example of pipeline processing of an object circuit including branch processing in the programmable logic circuit apparatus according to the third embodiment. FIG. 9 differs from FIG. 7 in that a FIFO memory 70-12 that stores data associated with the circuit block C3 as the branch destination (i.e., a set of data and the data output order) among data stored in the memory area 60-1 in the RAM for branch processing-A is connected to the input port of the circuit block C3 performed after the branching, and a FIFO memory 70-14 that stores data associated with the circuit block C5 as the branch destination (i.e., a set of data and the data output order) among data stored in the memory area 60-1 in the RAM for branch processing-A is connected to the input port of the circuit block C5 performed after the branching. In FIG. 9, the function of a FIFO 70-13 is similar to that of the FIFO-2 shown in FIG. 7.

If, for example, data shown in FIG. 8A is already stored in the memory area 60-1 in FIG. 9, data shown in FIG. 10A are stored in the FIFO memory 70-12, and data shown in FIG. 10B are stored in the FIFO 70-14. In other words, the circuit block C3 inputs the data shown in FIG. 10A, and the data as shown in FIG. 8B is output from the circuit block C4 via the FIFO 70-13. The circuit block C5 inputs the data shown in FIG. 10B, and outputs the data as shown in FIG. 8C. These output data are stored in the second memory area 60-2 in the RAM for branch processing-A, and a result obtained by rearranging in the data output order is stored in the FIFO memory 70-5.

In the third embodiment also, therefore, similar effects as those in the second embodiment can be brought about.

The present invention is not limited to the specific embodiments explained above. Further effects and modified examples can be derived easily by those skilled in the art. In other words, embodiments according to the present invention can be subject to various changes without departing from the spirit of the invention according to appended claims and those equivalents.

As explained above, the programmable logic circuit apparatus and the programmable logic circuit reconfiguration method according to the present invention are useful to dynamically reconfigure an object circuit having much branch processing on a programmable logic circuit, and especially suitable for providing a circuit that performs data communication processing and image compression processing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A programmable logic circuit apparatus comprising:
    a programmable logic circuit that dynamically switches and operates a plurality of circuit blocks, the circuit blocks including a branch circuit block that performs branch processing and a plurality of child circuit blocks that selectively perform a plurality of kinds of processing on data obtained by the branch circuit block;
    a storage unit that stores data obtained by the branch circuit block and an identifier of a child circuit block into which the data is input, the identifier being associated with the data; and
    a controller that causes the programmable logic circuit to process data associated with the same identifier as an identifier of a child circuit block being in operation in the programmable logic circuit, among the data stored in the storage unit, in preference to data associated with identifiers of other child circuit blocks.

2. The programmable logic circuit apparatus according to claim 1, wherein
    the storage unit further stores numbers indicating output order of the data from the storage unit, and the controller rearranges data obtained by at least one of other child circuit block and other branch circuit block which are performed after branch processing performed by the branch circuit block, based on the numbers.

3. The programmable logic circuit apparatus according to claim 1, wherein if an identifier of a child circuit block being in operation in the programmable logic circuit is not stored in the storage unit, the controller operates a child circuit block indicated by an identifier stored in a predetermined location of the storage unit into operation in the programmable logic circuit.

4. The programmable logic circuit apparatus according to claim 1, wherein
the controller counts a number of data stored in the storage unit, and
if the number of data exceeds a predetermined number, the controller causes the programmable logic circuit to process data associated with an identifier of a child circuit block being in operation in the programmable logic circuit, among the identifiers stored in the storage unit, in preference to data associated with identifiers of other child circuit blocks.

5. The programmable logic circuit apparatus according to claim 1, wherein
the controller counts a number of data stored in the storage unit, and
if the number of data associated with the same identifier among the data exceeds a predetermined number, the controller causes the programmable logic circuit to process data associated with an identifier of a child circuit block being in operation in the programmable logic circuit, among the identifiers stored in the storage unit, in preference to data associated with identifiers of other child circuit blocks.

6. The programmable logic circuit apparatus according to claim 1, wherein the storage unit includes a random access memory for the branch circuit block and a first-in first-out memory for the circuits blocks different from the branch circuit block.

7. A method of reconfiguring a programmable logic circuit that dynamically switches and operates a plurality of circuit blocks, the circuit blocks including a branch circuit block that performs branch processing and a plurality of child circuit blocks that selectively perform a plurality of kinds of processing on data obtained by the branch circuit block, the method comprising:

storing data obtained by the branch circuit block and an identifier of a child circuit block into which the data is input, in a storing unit, the identifier being associated with the data; and causing the programmable logic circuit to process data associated with the same identifier as an identifier of a child circuit block being in operation in the programmable logic circuit, among the data stored in the storage unit, in preference to data associated with identifiers of other child circuit blocks.

8. The method according to claim 7, further comprising rearranging data obtained by at least one of other child circuit block and other branch circuit block which are performed after branch processing performed by the branch circuit block, based on numbers indicating output order of the data.

9. The method according to claim 7, further comprising if an identifier of a child circuit block being in operation in the programmable logic circuit is not present in the identifiers stored in the storage unit, operating a child circuit block indicated by an identifier stored in a predetermined location of the storage unit into operation in the programmable logic circuit.

10. The method according to claim 7, further comprising if a number of data exceeds a predetermined number, causing the programmable logic circuit to process data associated with an identifier of a child circuit block being in operation in the programmable logic circuit, among the identifiers stored in the storage unit, in preference to data associated with identifiers of other child circuit blocks.

11. The method according to claim 7, further comprising if a number of data associated with the same identifier among the data exceeds a predetermined number, causing the programmable logic circuit to process data associated with an identifier of a child circuit block being in operation in the programmable logic circuit, among the identifiers stored in the storage unit, in preference to data associated with identifiers of other child circuit blocks.

12. The method according to claim 7, wherein the storage unit includes a random access memory for the branch circuit block and a first-in first-out memory for the circuits blocks different from the branch circuit block.

* * * * *